United States Patent
Liu et al.

(10) Patent No.: US 9,337,318 B2
(45) Date of Patent: May 10, 2016

(54) FINFET WITH DUMMY GATE ON NON-RECESSED SHALLOW TRENCH ISOLATION (STI)

(71) Applicant: Taiwan Semiconductor Manufacturing Company, Ltd., Hsin-Chu (TW)

(72) Inventors: Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/662,194

(22) Filed: Oct. 26, 2012

(65) Prior Publication Data
US 2014/0117454 A1    May 1, 2014

(51) Int. Cl.
*H01L 29/78* (2006.01)
*H01L 29/66* (2006.01)

(52) U.S. Cl.
CPC .......... *H01L 29/6681* (2013.01); *H01L 29/785* (2013.01)

(58) Field of Classification Search
CPC .................. H01L 29/66545; H01L 21/823878
USPC .......................................... 257/368, E21.409
See application file for complete search history.

(56) References Cited

U.S. PATENT DOCUMENTS

| | | | |
|---|---|---|---|
| 7,498,246 B2* | 3/2009 | Kim | 438/585 |
| 7,728,381 B2 | 6/2010 | Kahng et al. | |
| 2008/0035991 A1 | 2/2008 | Lee et al. | |
| 2008/0111194 A1* | 5/2008 | Kawakita | 257/365 |
| 2008/0251779 A1* | 10/2008 | Kakoschke et al. | 257/5 |
| 2009/0152734 A1* | 6/2009 | Smayling | 257/774 |
| 2009/0278196 A1* | 11/2009 | Chang et al. | 257/328 |
| 2010/0001331 A1* | 1/2010 | Mikasa | 257/306 |
| 2010/0276756 A1* | 11/2010 | Rachmady et al. | 257/365 |
| 2010/0317163 A1 | 12/2010 | Seliskar | |
| 2012/0299115 A1* | 11/2012 | Chuang et al. | 257/379 |
| 2012/0319167 A1* | 12/2012 | van Dal et al. | 257/192 |
| 2013/0187237 A1* | 7/2013 | Yu et al. | 257/369 |

FOREIGN PATENT DOCUMENTS

| | | |
|---|---|---|
| KR | 100744137 | 7/2007 |
| KR | 100827656 | 4/2008 |

* cited by examiner

*Primary Examiner* — Peter Bradford
(74) *Attorney, Agent, or Firm* — Slater & Matsil, L.L.P.

(57) ABSTRACT

An embodiment fin field effect transistor (FinFET) device includes fins formed from a semiconductor substrate, a non-recessed shallow trench isolation (STI) region disposed between the fins, and a dummy gate disposed on the non-recessed STI region.

20 Claims, 11 Drawing Sheets

US 9,337,318 B2

FINFET WITH DUMMY GATE ON NON-RECESSED SHALLOW TRENCH ISOLATION (STI)

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. FinFETs not only improve areal density, but also improve gate control of the channel.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a FinFET metal oxide semiconductor (MOS). The disclosure may also be applied, however, to other integrated circuits, electronic structures, and the like.

Figure 1:
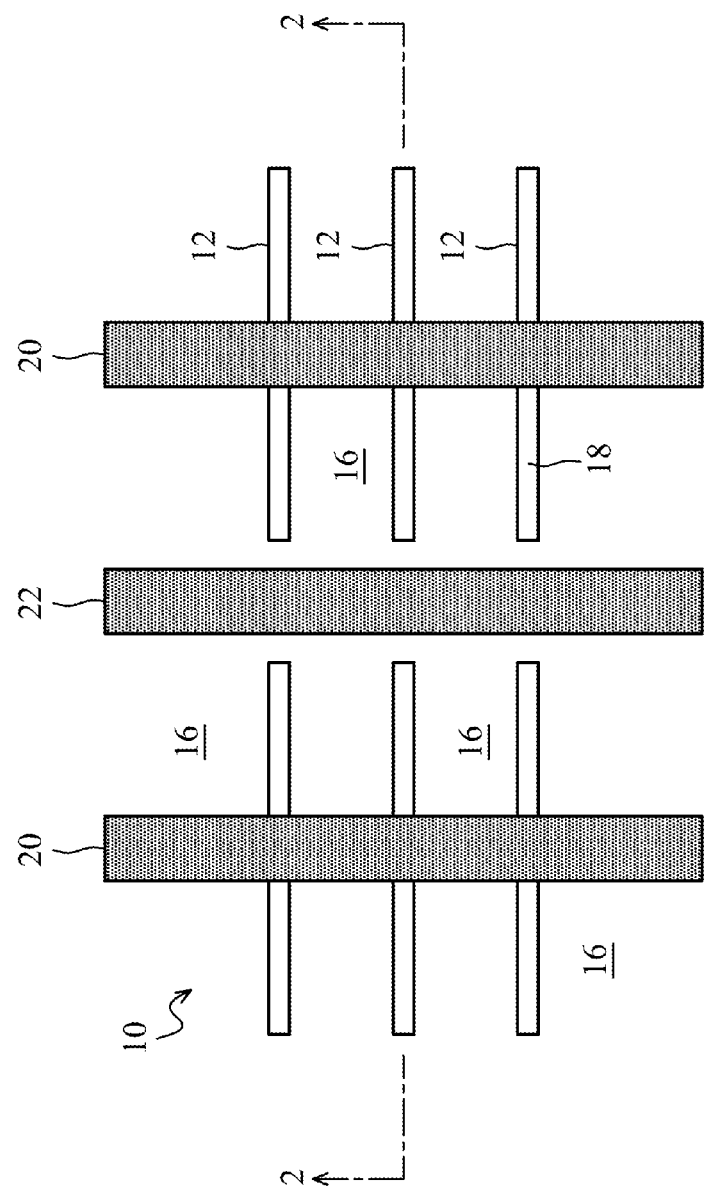
FIG. 1 is a top plan view of a conventional fin field-effect transistor (FinFET)
Figure 2:
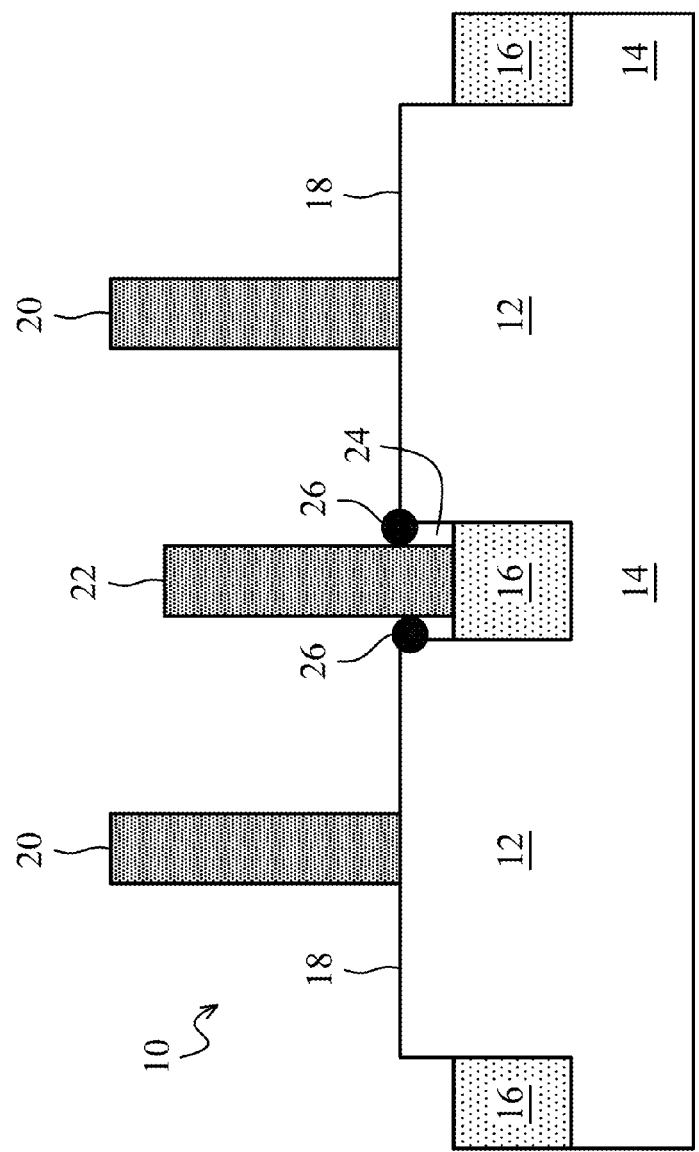
FIG. 2 is a cross-sectional view of the conventional FinFET of FIG. 1 taken along line 2-2.

Referring now to FIGS. 1-2, a conventional FinFET 10 is illustrated for reference. As shown, the conventional FinFET 10 includes fins 12 formed in a silicon or silicon-containing substrate 14. Shallow trench isolation (STI) regions 16 are formed between and next to the fins 12. Notably, the STI regions 16 are recessed relative to a top surface 18 of the adjacent fins 12.

Still referring to FIGS. 1-2, active gates 20 are formed over the fins 12. In addition, a dummy gate 22 is formed over one of the recessed STI regions 16. As shown, the recessed STI region 16 forms a gap 24 between the fins 12 and the dummy gate 22 where unwanted debris, particles, or contaminants 26 may enter. These contaminants 26 may degrade the performance and reliability of the conventional FinFET 10.

Figure 3:
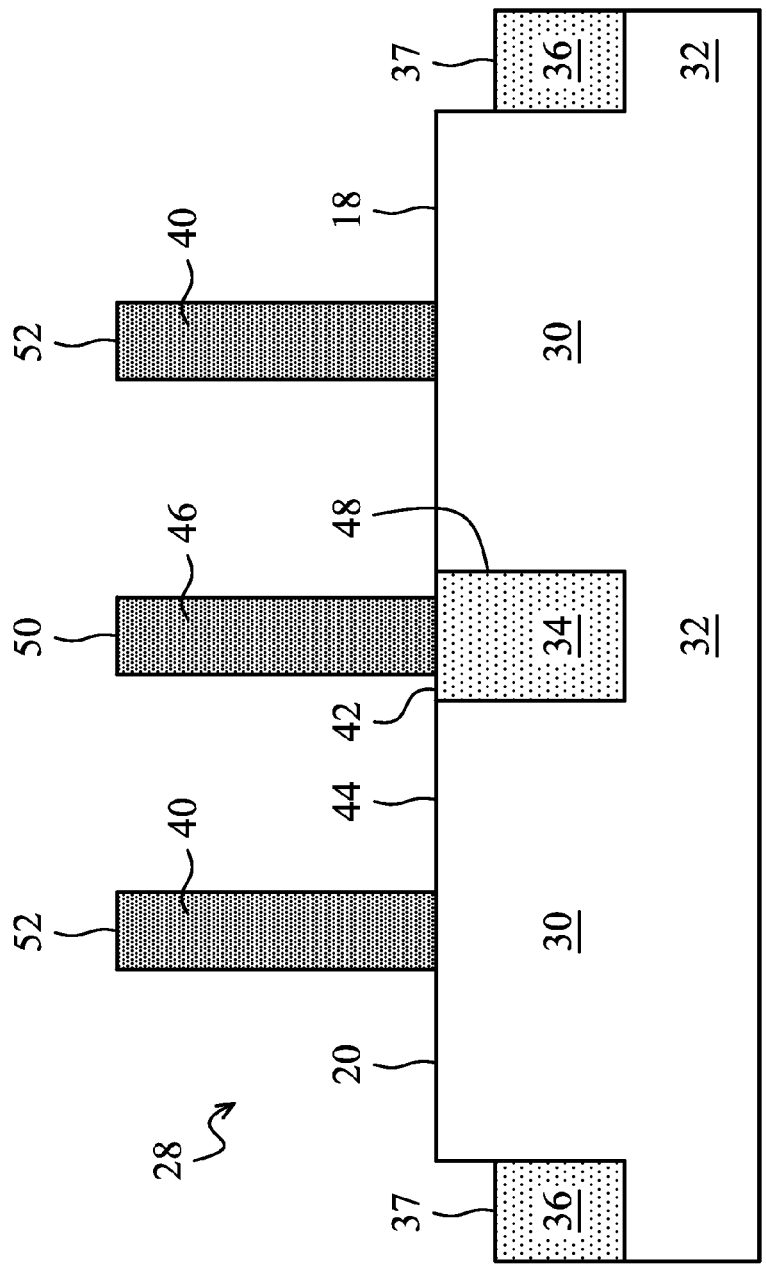
FIG. 3 is an embodiment fin field-effect transistor (FinFET) having a non-recessed shallow trench isolation (STI) region supporting a dummy gate.

Referring now to FIG. 3, an embodiment fin field-effect transistors (FinFET) 28 is illustrated. As shown, the embodiment FinFET 28 includes fins 30 formed from a semiconductor substrate 32, a non-recessed shallow trench isolation (STI) region 34, recessed shallow trench isolation regions 36, a dummy gate 38, and active gates 40. In an embodiment, the semiconductor substrate 32 is formed from silicon, a silicon-containing material (e.g., silicon germanium, SiGe, etc.) or a silicon-on-insulator (SOI) substrate.

Still referring to FIG. 3, the non-recessed STI region 34 is disposed between the fins 30. In other words, the non-recessed STI region 34 is embedded in the semiconductor substrate 32. As shown, a top surface 42 of the non-recessed STI region 34 and a top surface 44 of the fins 30 are co-planar. Indeed, sidewalls 46 of the dummy gate 38 are disposed above sidewalls 48 of the fins 30. In an embodiment, the non-recessed STI region 34 is formed from, for example, silicon oxide, silicon nitride, or another suitable insulating material.

In addition to the non-recessed STI region 34, the embodiment FinFET 28 also includes recessed STI regions 36. As shown, the recessed STI regions 36 are formed over the semiconductor substrate 32 and adjacent to the fins 30. The recessed STI regions 36 have a top surface 37 below the top surface 42 of the non-recessed STI region 34 and the top surface 44 of the fins 30.

As shown in FIG. 3, the non-recessed STI region 34 supports the dummy gate 38. In contrast, the recessed STI regions 36 are each free of any of the dummy gates 38. Each of the fins 30 supports one of the active gates 40. As depicted in FIG. 3, in an embodiment the dummy gate 38 is horizontally aligned with the active gates 40. Therefore, a top surface 50 of the dummy gate 38 and a top surface 52 of the active gates 40 are co-planar.

Each of the active gates 40 and the dummy gate 38 may be formed from, for example, a polysilicon or other suitable gate material. In addition, in an embodiment the active gates 40 and/or the dummy gate 38 may represent a gate stack including other gate structures (e.g., an interfacial oxide layer, a high-k value gate dielectric layer, and a metal layer, etc.).

Figure 4A:
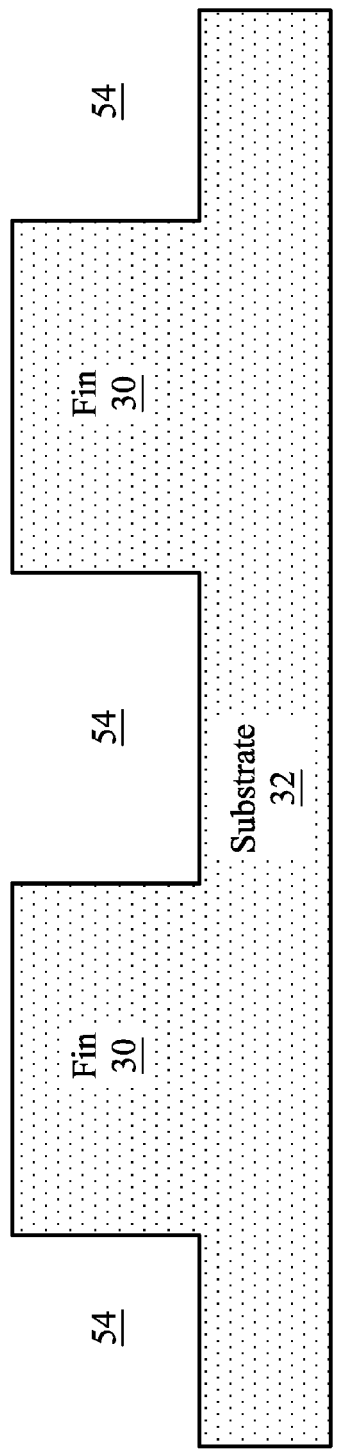
FIGS. 4a-4g collectively illustrate a process flow for forming the embodiment FinFET of FIG. 3.
Figure 4B:
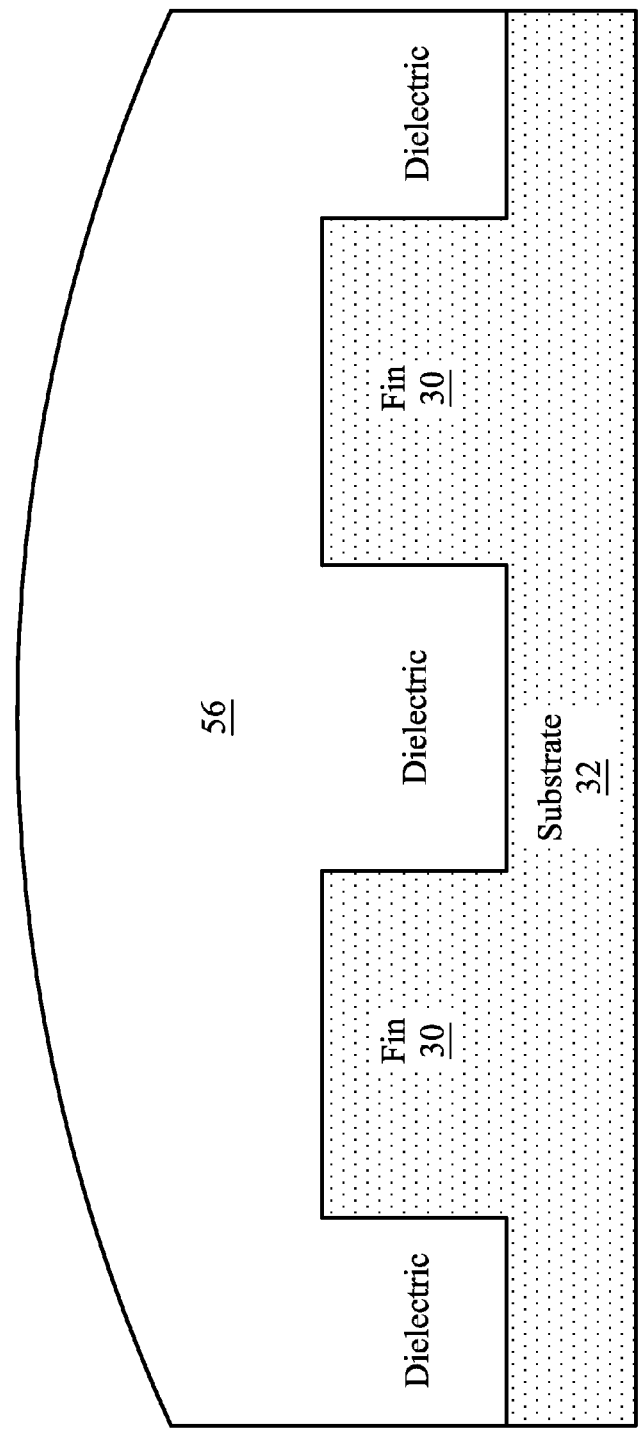

FIGS. 4a-4g collectively illustrate a process flow for forming the embodiment FinFET 28 of FIG. 3. As shown in FIG. 4a, trenches 54 are formed in the semiconductor substrate 32 to define the fins 30. The trenches 54 may be formed by, for example, an etching process. Next, as shown in FIG. 4b, a dielectric 56 (e.g., silicon dioxide, etc.) is deposited in the trenches 54 and over the fins 30. The dielectric 56 may be deposited by, for example, a chemical vapor deposition (CVD) process, and so on.

Figure 4C:
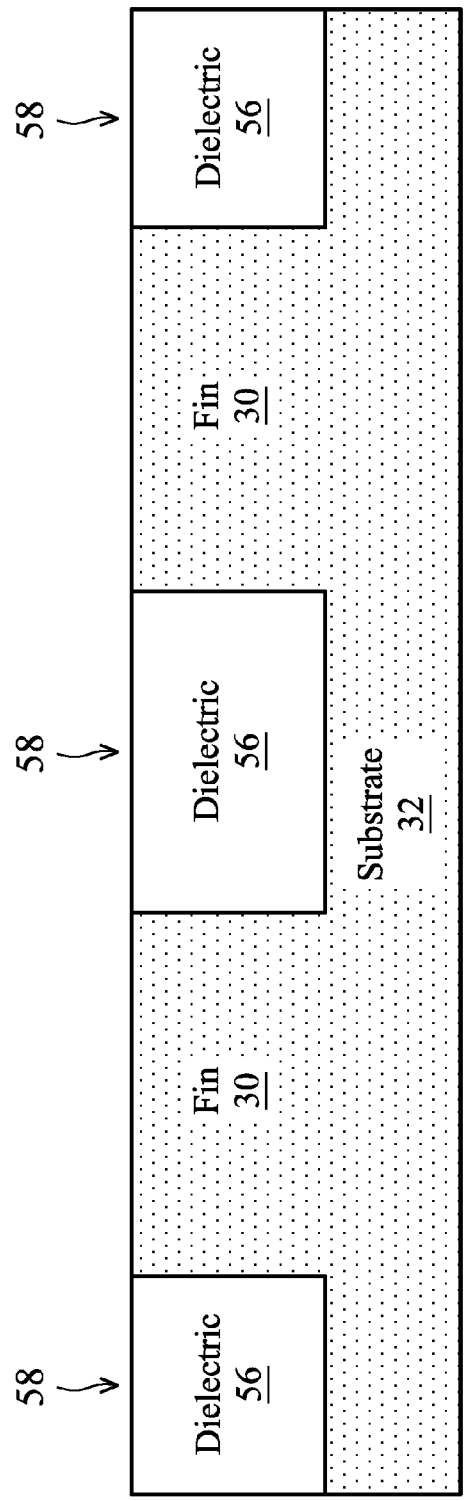
Figure 4D:
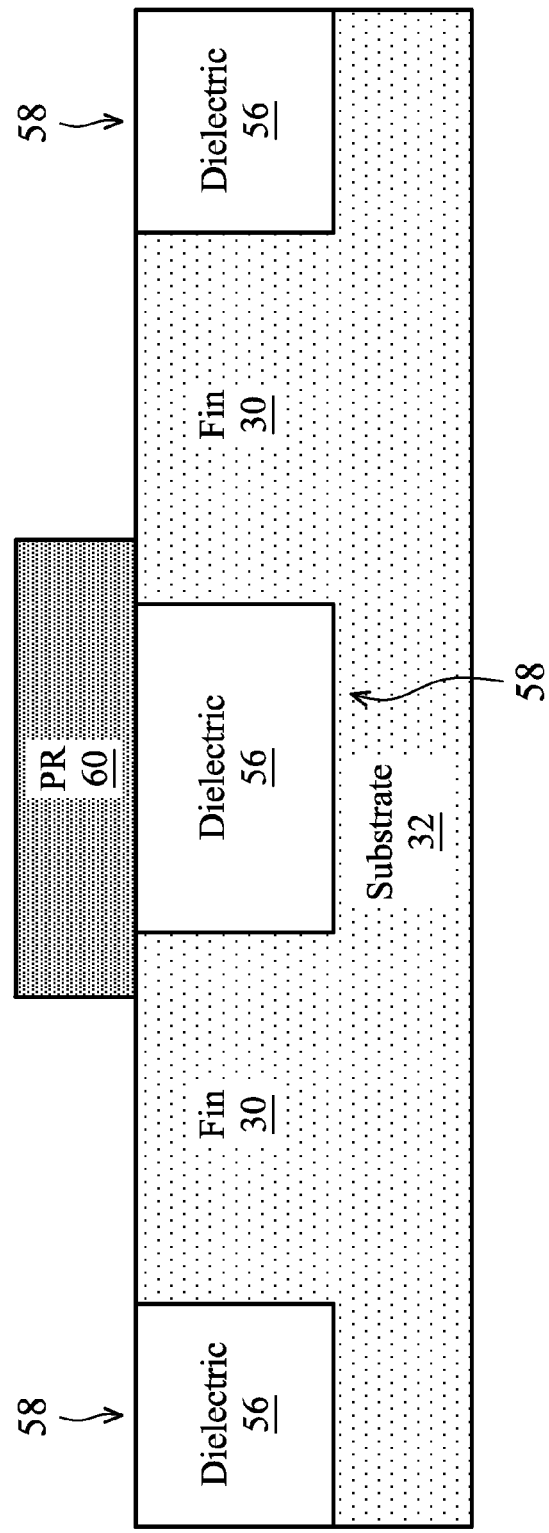

Moving on to FIG. 4c, a chemical-mechanical planarization process (CMP) is performed to remove the upper portions of the dielectric 56 and define STI regions 58. Next, in FIG. 4d, a patterning photoresist (PR) 60 is disposed over the STI region 58 (i.e., the non-recessed STI region 34) between the fins 30. By covering the non-recessed STI region 34 with the PR 60, the non-recessed STI region 34 is protected from the effects of further processing.

Figure 4E:
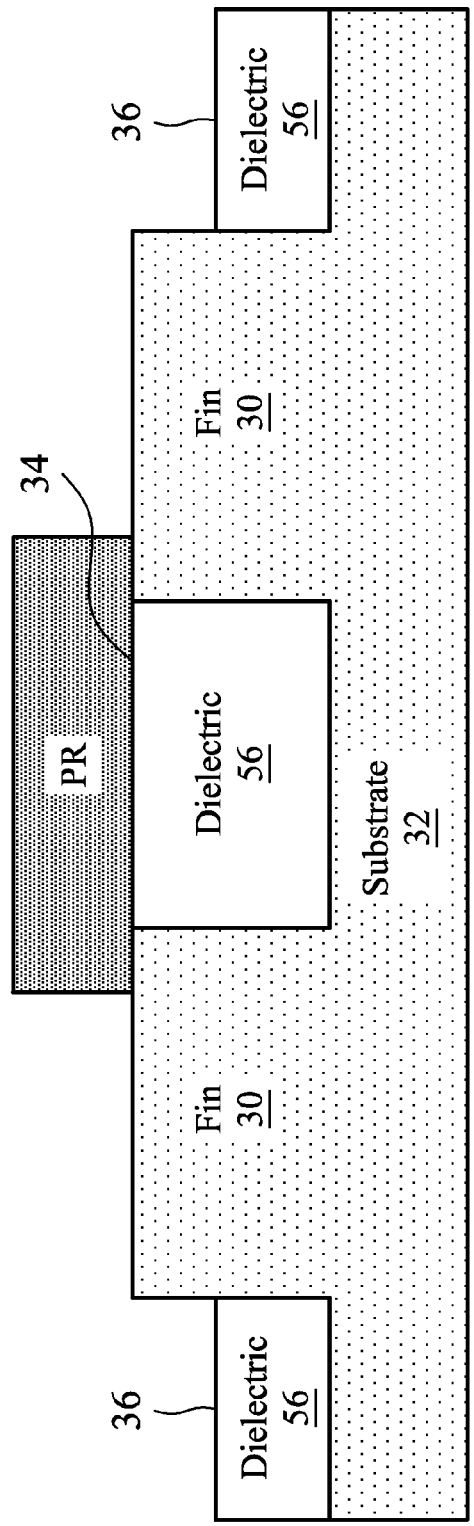
Figure 4F:
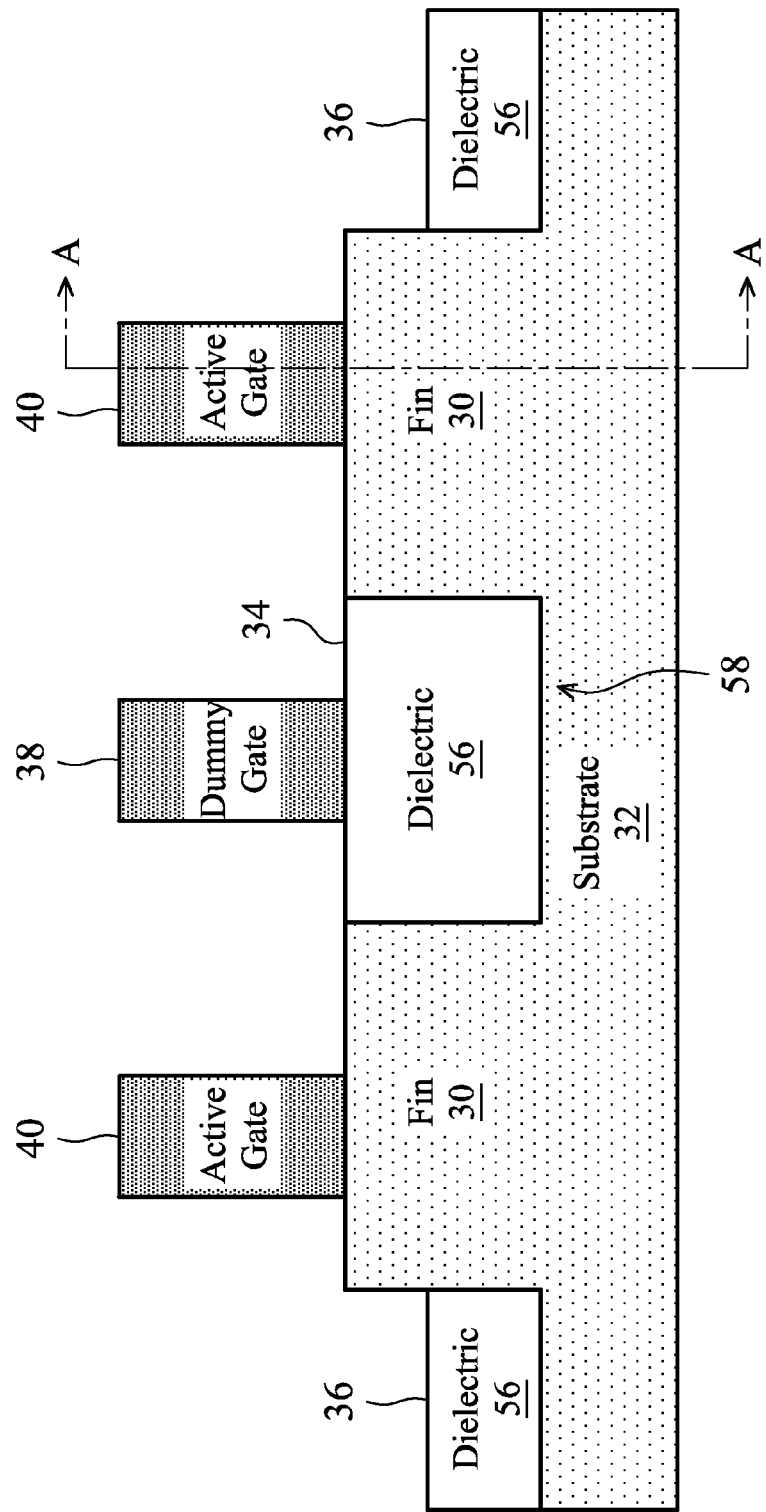
Figure 4G:
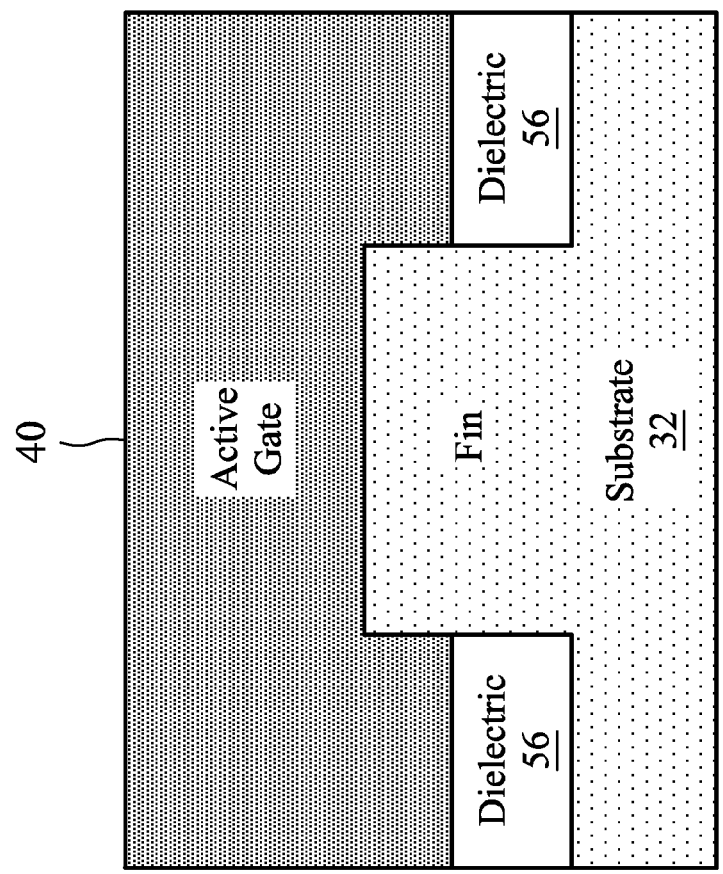

Moving on to FIG. 4e, an etching or other process is performed. The etching process removes upper portions of the dielectric 56 not covered or protected by the PR 60. By removing the upper portions of the dielectric 56, the recessed STI regions 36 shown in FIG. 4e are defined. Next, as shown in FIG. 4f, the PR 60 is removed. Thereafter, the active gates 40 are formed over the fins 30 and the dummy gate 38 is formed over the non-recessed STI region 34. FIG. 4g is a cross-sectional view along the A-A line illustrated in FIG. 4f, providing a cross-sectional view along the fin as the fin extends into and out of the page. As illustrated, the active gate 40 extends along opposing sidewalls of the fin 30 as the fin extends through the dielectric 56. In an embodiment, the active gates 40 and the dummy gate 38 are formed simultaneously. As shown, the gap 24 found in the conventional FinFET 10 of FIG. 2 is absent from the embodiment FinFET of FIG. 3. As such, the embodiment FinFET 28 of FIG. 3 is free of the undesirable contaminants 26 depicted in FIG. 2.

Figure 5:
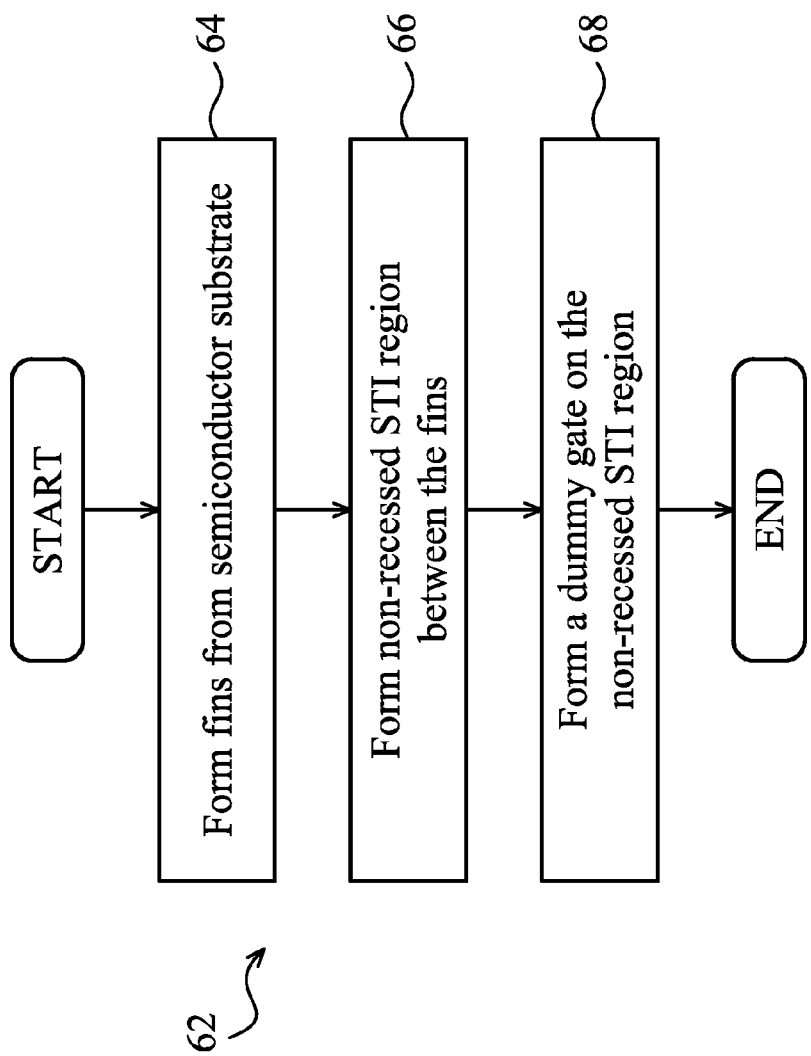
FIG. 5 is a method of forming the embodiment FinFET of FIG. 3.

Referring now to FIG. 5, an embodiment method 62 of forming the embodiment FinFET 28 of FIG. 3 is illustrated. In block 64, the fins 30 are formed from the semiconductor substrate 32. In block 66, the non-recessed STI region 34 is formed between the fins 30. Then, in block 68, the dummy gate 38 is formed on the non-recessed STI region 34. It should be recognized that further or additional processing steps may be performed to complete the embodiment FinFET 28 of FIG. 3.

An embodiment fin field effect transistor (FinFET) device includes fins formed from a semiconductor substrate, a non-recessed shallow trench isolation (STI) region disposed between the fins, and a dummy gate disposed on the non-recessed STI region.

An embodiment fin field effect transistor (FinFET) device includes fins formed from a semiconductor substrate, a shallow trench isolation (STI) region formed adjacent the fins, the STI region having at least one recessed portion and at least one non-recessed portion, an active gate formed over each of the fins, and a dummy gate formed between the active gates and over the non-recessed portion of the STI region.

An embodiment method of forming a fin field effect transistor (FinFET) device includes forming fins from a semiconductor substrate, forming a non-recessed shallow trench isolation (STI) region between the fins, and forming a dummy gate on the non-recessed STI region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A fin field effect transistor (FinFET) device, comprising:
    a semiconductor substrate comprising fins, the fins comprising a first fin, the first fin having a first longitudinal axis;
    a non-recessed shallow trench isolation (STI) region disposed between the fins, the non-recessed STI region adjoining a first end of the first fin, the first longitudinal axis intersecting the non-recessed STI region;
    a recessed STI region over the semiconductor substrate and adjoining a second end of the first fin, the second end being opposite the first end, the first longitudinal axis intersecting the recessed STI region;
    a dummy gate disposed on the non-recessed STI region without extending over any fins; and
    a first active gate extending along opposing sidewalls of the first fin, the first active gate extending along an uppermost surface of the first fin.

2. The FinFET device of claim 1, wherein a top surface of the non-recessed STI region and a top surface of the fins are co-planar.

3. The FinFET device of claim 1, wherein a second active gate is formed over another of the fins and wherein the first active gate and the second active gate are formed on opposing sides of the dummy gate.

4. The FinFET device of claim 3, wherein a top surface of the dummy gate and a top surface of the first and second active gates are co-planar.

5. The FinFET device of claim 1, wherein the recessed STI region is free of any dummy gates.

6. The FinFET device of claim 1, wherein the semiconductor substrate comprises silicon.

7. The FinFET device of claim 1, wherein a longitudinal axis of the dummy gate is perpendicular to a longitudinal axis of the fins.

8. The FinFET device of claim 1, wherein longitudinal axes of the fins are collinear.

9. A fin field effect transistor (FinFET) device, comprising:
    a semiconductor substrate comprising a first fin and a second fin, longitudinal axes of the first fin and the second fin being collinear;
    a non-recessed shallow trench isolation (STI) region disposed between the first fin and the second fin, a top surface of the non-recessed STI region and a top surface of the first fin and the second fin being co-planar;
    a recessed STI region disposed adjacent the first fin and the second fin;
    active gates, each of the active gates extending along sidewalls of a corresponding one of the first fin and the second fin and a top surface of the corresponding one of the first fin and the second fin; and
    a dummy gate disposed between the active gates and over the non-recessed STI region, the dummy gate disposed completely over a shallow trench isolation region.

10. The FinFET device of claim 9, wherein a top surface of the dummy gate and a top surface of the active gates are co-planar.

11. The FinFET device of claim 9, wherein the recessed STI region is formed on sides of the first fin and the second fin.

12. The FinFET device of claim 11, wherein the recessed STI region is free of any dummy gates.

13. The FinFET device of claim 9, wherein the dummy gate is parallel to the active gates.

14. The FinFET device of claim 9, wherein a longitudinal axis of the dummy gate is parallel to a longitudinal axis of a first active gate of the active gates.

15. A fin field effect transistor (FinFET) device, comprising:
    a substrate having fins extending therefrom;
    a non-recessed shallow trench isolation (STI) region disposed between the fins, at least one of the fins having a longitudinal axis intersecting the non-recessed STI region;
    recessed STI regions disposed on opposing sides of the non-recessed shallow trench isolation region
    an active gate formed over each of the fins, the active gate extending over opposing sidewalls of each of the fins; and
    a dummy gate formed between the active gates and over the non-recessed STI region without extending over any active areas.

16. The FinFET device of claim 15, wherein the recessed STI regions are laterally adjacent to the non-recessed STI region.

17. The FinFET device of claim 15, wherein an upper surface of the recessed STI regions is free of any dummy gates.

18. The FinFET device of claim 15, wherein the dummy gate is entirely disposed over the non-recessed STI region.

19. The FinFET device of claim 15, wherein longitudinal axes of the fins are collinear.

20. The FinFET device of claim 15, wherein a top surface of the non-recessed STI region and a top surface of the fins are co-planar.

* * * * *